United States Patent
Chien et al.

(10) Patent No.: US 8,742,498 B2
(45) Date of Patent: Jun. 3, 2014

(54) HIGH VOLTAGE SEMICONDUCTOR DEVICE AND FABRICATING METHOD THEREOF

(75) Inventors: Fu-Chun Chien, Hsinchu County (TW); Ching-Wei Teng, Taoyuan County (TW); Nien-Chung Li, Hsinchu (TW); Chih-Chung Wang, Hsinchu (TW); Te-Yuan Wu, Hsinchu (TW); Li-Che Chen, Pingtung County (TW); Chih-Chun Pu, Hsinchu (TW); Yu-Ting Yeh, Tainan (TW); Kuan-Wen Lu, Hsinchu (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 13/288,072

(22) Filed: Nov. 3, 2011

(65) Prior Publication Data

US 2013/0113048 A1    May 9, 2013

(51) Int. Cl.
*H01L 29/66*    (2006.01)
*H01L 21/70*    (2006.01)

(52) U.S. Cl.
USPC ........... 257/339; 257/335; 257/338; 257/369; 257/E29.256

(58) Field of Classification Search
None
See application file for complete search history.

(56) References Cited

U.S. PATENT DOCUMENTS

| | | | |
|---|---|---|---|
| 4,344,081 A | 8/1982 | Pao | |
| 4,396,999 A | 8/1983 | Malaviya | |
| 4,893,160 A | 1/1990 | Blanchard | |
| 4,918,333 A | 4/1990 | Anderson | |
| 4,958,089 A | 9/1990 | Fitzpatrick | |
| 5,040,045 A | 8/1991 | McArthur | |
| 5,268,589 A | 12/1993 | Dathe | |
| 5,296,393 A | 3/1994 | Smayling | |
| 5,326,711 A | 7/1994 | Malhi | |
| 5,346,835 A | 9/1994 | Malhi | |
| 5,430,316 A | 7/1995 | Contiero | |
| 5,436,486 A | 7/1995 | Fujishima | |
| 5,534,721 A | 7/1996 | Shibib | |
| 5,811,850 A | 9/1998 | Smayling | |
| 5,950,090 A | 9/1999 | Chen | |
| 5,998,301 A | 12/1999 | Pham | |
| 6,051,459 A * | 4/2000 | Gardner et al. | 438/231 |
| 6,066,884 A | 5/2000 | Krutsick | |
| 6,144,538 A | 11/2000 | Chao | |
| 6,165,846 A | 12/2000 | Carns | |
| 6,245,689 B1 | 6/2001 | Hao | |
| 6,277,675 B1 | 8/2001 | Tung | |
| 6,277,757 B1 | 8/2001 | Lin | |
| 6,297,108 B1 | 10/2001 | Chu | |

(Continued)

*Primary Examiner* — Julio J Maldonado
*Assistant Examiner* — Harpreet Singh
(74) *Attorney, Agent, or Firm* — Ding Yu Tan

(57) ABSTRACT

A method for fabricating a high voltage semiconductor device is provided. Firstly, a substrate is provided, wherein the substrate has a first active zone and a second active zone. Then, a first ion implantation process is performed to dope the substrate by a first mask layer, thereby forming a first-polarity doped region at the two ends of the first active zone and a periphery of the second active zone. After the first mask layer is removed, a second ion implantation process is performed to dope the substrate by a second mask layer, thereby forming a second-polarity doped region at the two ends of the second active zone and a periphery of the first active zone. After the second mask layer is removed, a first gate conductor structure and a second gate conductor structure are formed over the middle segments of the first active zone and the second active zone, respectively.

10 Claims, 4 Drawing Sheets

(56) References Cited

U.S. PATENT DOCUMENTS

| | | | |
|---|---|---|---|
| 6,306,700 B1 * | 10/2001 | Yang ............................ 438/217 |
| 6,326,283 B1 | 12/2001 | Liang |
| 6,353,247 B1 | 3/2002 | Pan |
| 6,388,292 B1 | 5/2002 | Lin |
| 6,400,003 B1 | 6/2002 | Huang |
| 6,424,005 B1 | 7/2002 | Tsai |
| 6,514,830 B1 | 2/2003 | Fang |
| 6,521,538 B2 | 2/2003 | Soga |
| 6,614,089 B2 | 9/2003 | Nakamura |
| 6,638,804 B2 * | 10/2003 | Kanda et al. ................... 438/200 |
| 6,713,794 B2 | 3/2004 | Suzuki |
| 6,762,098 B2 | 7/2004 | Hshieh |
| 6,764,890 B1 | 7/2004 | Xu |
| 6,784,060 B2 | 8/2004 | Ryoo |
| 6,784,490 B1 | 8/2004 | Inoue |
| 6,819,184 B2 | 11/2004 | Pengelly |
| 6,822,296 B2 | 11/2004 | Wang |
| 6,825,531 B1 | 11/2004 | Mallikarjunaswamy |
| 6,846,729 B2 | 1/2005 | Andoh |
| 6,855,581 B2 | 2/2005 | Roh |
| 6,869,848 B2 | 3/2005 | Kwak |
| 6,894,349 B2 | 5/2005 | Beasom |
| 6,958,515 B2 | 10/2005 | Hower |
| 7,015,116 B1 | 3/2006 | Lo |
| 7,023,050 B2 | 4/2006 | Salama |
| 7,037,788 B2 | 5/2006 | Ito |
| 7,075,575 B2 | 7/2006 | Hynecek |
| 7,091,079 B2 | 8/2006 | Chen |
| 7,148,540 B2 | 12/2006 | Shibib |
| 7,214,591 B2 | 5/2007 | Hsu |
| 7,309,636 B2 | 12/2007 | Chen |
| 7,323,740 B2 | 1/2008 | Park |
| 7,358,567 B2 | 4/2008 | Hsu |
| 7,372,104 B2 * | 5/2008 | Wu et al. ........................ 257/335 |
| 7,427,552 B2 | 9/2008 | Jin |
| 2003/0022460 A1 | 1/2003 | Park |
| 2004/0018698 A1 | 1/2004 | Schmidt |
| 2004/0070050 A1 | 4/2004 | Chi |
| 2005/0158939 A1 * | 7/2005 | Williams et al. ............... 438/199 |
| 2005/0227448 A1 | 10/2005 | Chen |
| 2005/0258496 A1 | 11/2005 | Tsuchiko |
| 2006/0035437 A1 | 2/2006 | Mitsuhira |
| 2006/0261407 A1 | 11/2006 | Blanchard |
| 2006/0270134 A1 | 11/2006 | Lee |
| 2006/0270171 A1 | 11/2006 | Chen |
| 2007/0041227 A1 | 2/2007 | Hall |
| 2007/0082440 A1 | 4/2007 | Shiratake |
| 2007/0132033 A1 | 6/2007 | Wu |
| 2007/0273001 A1 | 11/2007 | Chen |
| 2008/0160697 A1 | 7/2008 | Kao |
| 2008/0160706 A1 | 7/2008 | Jung |
| 2008/0185629 A1 | 8/2008 | Nakano |
| 2008/0296655 A1 | 12/2008 | Lin |
| 2009/0108348 A1 | 4/2009 | Yang |
| 2009/0111252 A1 | 4/2009 | Huang |
| 2009/0159966 A1 * | 6/2009 | Huang ........................... 257/334 |
| 2009/0278208 A1 | 11/2009 | Chang |
| 2009/0294865 A1 | 12/2009 | Tang |
| 2010/0006937 A1 | 1/2010 | Lee |
| 2010/0032758 A1 | 2/2010 | Wang |
| 2010/0096702 A1 | 4/2010 | Chen |
| 2010/0148250 A1 | 6/2010 | Lin |
| 2010/0213517 A1 | 8/2010 | Sonsky |
| 2010/0258867 A1 * | 10/2010 | Lee et al. ........................ 257/339 |
| 2011/0057263 A1 | 3/2011 | Tang |
| 2011/0248342 A1 * | 10/2011 | Kim et al. ....................... 257/337 |

* cited by examiner

HIGH VOLTAGE SEMICONDUCTOR DEVICE AND FABRICATING METHOD THEREOF

FIELD OF THE INVENTION

The present invention relates to a semiconductor device and a fabricating method thereof, and more particularly to a high voltage semiconductor device and a fabricating method thereof.

BACKGROUND OF THE INVENTION

Nowadays, the integration of different function circuit modules into the same semiconductor chip is gradually adopted in the fabrication of an integrated circuit. As known, these function circuit modules have respective operating voltage ranges. It is a challenge of integrating so many function circuit modules having different operating voltage ranges into the same semiconductor chip.

FIG. 1 is a schematic cross-sectional view illustrating a conventional double-diffused-drain high voltage N-type MOSFET (also referred as DDD HV NMOS device). The DDD HV NMOS device is a high voltage semiconductor device produced by the general semiconductor fabricating process. As shown in FIG. 1, the conventional DDD HV NMOS device comprises a substrate 1, a high voltage P-well region (HV P-Well) 10, an N-field region 11 (N-Field), an N-grade region (N-Grade) 12, a heavily N-doped region 13 (N+), and a gate structure 14. As known, the components of the circuit modules with different operating voltage ranges are very distinguished. In addition, a complementary metal-oxide-semiconductor (CMOS) transistor fabricating process is a widely-used semiconductor fabricating process by forming an N-channel metal-oxide-semiconductor field-effect transistor and a P-channel metal-oxide-semiconductor field-effect transistor on the same substrate. In other words, since it is difficult to integrate the steps of this semiconductor fabricating process, the number of photo masks is too huge and the fabricating cost is high. In addition, the device stability of the high voltage metal-oxide-semiconductor is usually unsatisfied. Therefore, there is a need of providing an improved fabricating method for a high voltage semiconductor device so as to obviate the above drawbacks.

SUMMARY OF THE INVENTION

In accordance with an aspect, the present invention provides a method for fabricating a high voltage semiconductor device. The method includes the following steps. Firstly, a substrate is provided, wherein the substrate has a first active zone and a second active zone. Then, a first mask layer is formed over the substrate. The second active zone is sheltered by the first mask layer, and the first mask layer has a first opening and a second opening, wherein two ends of the first active zone are exposed to the first opening and the second opening, respectively. Then, a first ion implantation process is performed to dope the substrate through the first opening and the second opening by using the first mask layer as an implantation mask layer, thereby forming a first-polarity doped region at the two ends of the first active zone and a periphery of the second active zone. Then, the first mask layer is removed. Then, a second mask layer is formed over the substrate. The first active zone is sheltered by the second mask layer, and the second mask layer has a third opening and a fourth opening, wherein two ends of the second active zone are exposed to the third opening and the fourth opening, respectively. Then, a second ion implantation process is performed to dope the substrate through the third opening and the fourth opening by using the second mask layer as the implantation mask layer, thereby forming a second-polarity doped region at the two ends of the second active zone and a periphery of the first active zone. Then, the second mask layer is removed. Afterwards, a first gate conductor structure is formed over a middle segment of the first active zone, and a second gate conductor structure is formed over a middle segment of the second active zone.

In an embodiment, the method further includes steps of performing a third ion implantation process to dope the substrate by using the first gate conductor structure as the implantation mask layer to form a first-polarity source/drain region over the first-polarity doped region, and performing a fourth ion implantation process to dope the substrate by using the second gate conductor structure as the implantation mask layer to form a second-polarity source/drain region over the second-polarity doped region.

In an embodiment, the first ion implantation process is carried out by steps of: performing a first depth implantation step to form a first-polarity field region of the first-polarity doped region at the periphery of the second active zone, and performing a second depth implantation step to form a first-polarity grade region of the first-polarity doped region at the two ends of the first active zone.

In an embodiment, the first-polarity grade region is extended beyond a corresponding end of the active zone by a length of about 0.3 micrometer.

In an embodiment, the second ion implantation process is carried out by steps of: performing a third depth implantation step to form a second-polarity field region of the second-polarity doped region at the periphery of the first active zone, and performing a fourth depth implantation step to form a second-polarity grade region of the second-polarity doped region at the two ends of the second active zone.

In an embodiment, the first-polarity grade region at the periphery of the first active zone is separated from the second-polarity field region by a distance of about 0.05 micrometer.

In an embodiment, the second-polarity field region at the periphery of the first active zone has a first protrusion part and a second protrusion part extended toward the middle segment of the first active zone, wherein the first protrusion part or the second protrusion part is separated from the first-polarity grade region by a distance of about 0.2 micrometer.

In an embodiment, the second-polarity doped region at the periphery of the first active zone has a first protrusion part and a second protrusion part extended toward the middle segment of the first active zone.

In an embodiment, the first gate conductor structure or the second gate conductor structure has a polysilicon conductor, wherein an overlapping region between the polysilicon conductor and the first-polarity grade region has a width of about 0.7 micrometer.

In an embodiment, the substrate is a silicon substrate, the first-polarity grade region is an N-grade region, the second-polarity grade region is a P-grade region, the first-polarity field region is an N-field region, and the second-polarity field region is a P-field region.

In accordance with another aspect, the present invention provides a high voltage semiconductor device. The high voltage semiconductor device includes a substrate, a first-polarity doped region, a second-polarity doped region, a first gate conductor structure, and a second gate conductor structure. The substrate has a first active zone and a second active zone. The first-polarity doped region is formed at two ends of the first active zone and a periphery of the second active zone. The second-polarity doped region is formed at two ends of the second active zone and a periphery of the first active zone, wherein the second-polarity doped region has a first protrusion part and a second protrusion part extended toward a middle segment of the first active zone. The first gate conductor structure is formed over the middle segment of the first active zone. The second gate conductor structure is formed over a middle segment of the second active zone.

In an embodiment, the high voltage semiconductor device further includes a first-polarity source/drain region and a second-polarity source/drain region. The first-polarity source/drain region is formed over the first-polarity doped region. The second-polarity source/drain region is formed over the second-polarity doped region.

In an embodiment, the first-polarity doped region includes a first-polarity field region and a first-polarity grade region. The first-polarity field region is formed at the periphery of the second active zone. The first-polarity grade region is formed at the two ends of the first active zone.

In an embodiment, the first-polarity grade region is extended beyond a corresponding end of the active zone by a length of about 0.3 micrometer.

In an embodiment, the second-polarity doped region includes a second-polarity field region and a second-polarity grade region. The second-polarity field region is formed at the periphery of the first active zone. The second-polarity grade region is formed at the two ends of the second active zone.

In an embodiment, the first-polarity grade region at the periphery of the first active zone is separated from the second-polarity field region by a distance of about 0.05 micrometer.

In an embodiment, the second-polarity field region at the periphery of the first active zone has the first protrusion part and the second protrusion part, wherein the first protrusion part or the second protrusion part is separated from the first-polarity grade region by a distance of about 0.2 micrometer.

In an embodiment, the first gate conductor structure or the second gate conductor structure has a polysilicon conductor.

In an embodiment, an overlapping region between the polysilicon conductor and the first-polarity grade region has a width of about 0.7 micrometer.

In an embodiment, the substrate is a silicon substrate, the first-polarity grade region is an N-grade region, the second-polarity grade region is a P-grade region, the first-polarity field region is an N-field region, and the second-polarity field region is a P-field region.

BRIEF DESCRIPTION OF THE DRAWINGS

The above objects and advantages of the present invention will become more readily apparent to those ordinarily skilled in the art after reviewing the following detailed description and accompanying drawings, in which.

DETAILED DESCRIPTION OF PREFERRED EMBODIMENTS

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

FIGS. 2A~2F are schematic top views illustrating a method for fabricating a double-diffused-drain high voltage N-type MOSFET (also referred as DDD HV NMOS device) according to an embodiment of the present invention.

Figure 1:
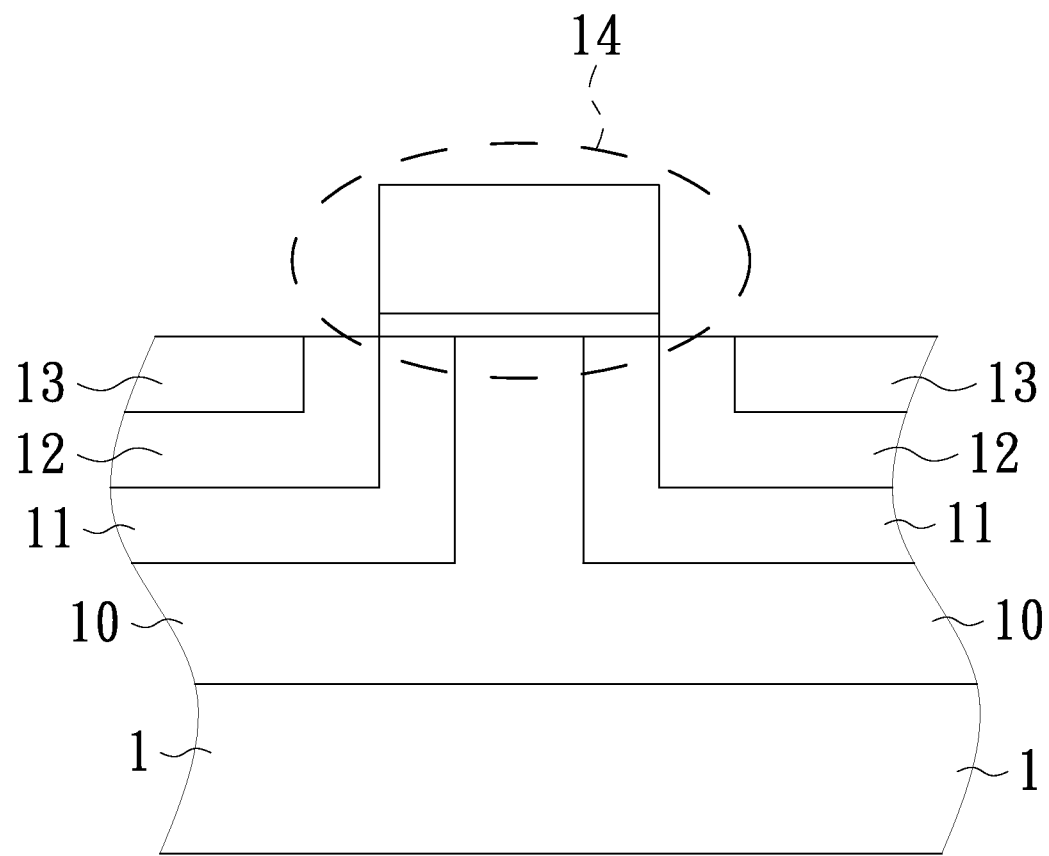
FIG. 1 is a schematic cross-sectional view illustrating a conventional double-diffused-drain high voltage N-type MOSFET.
Figure 2A:
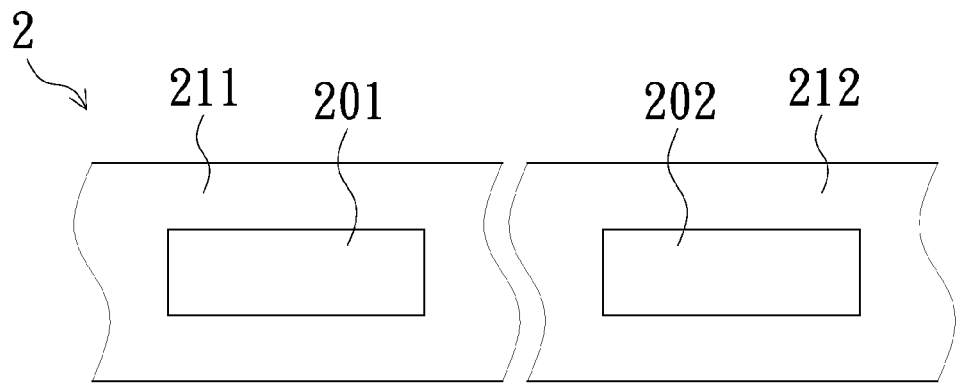
FIGS. 2A~2F are schematic top views illustrating a method for fabricating a double-diffused-drain high voltage N-type MOSFET according to an embodiment of the present invention.

First of all, as shown in FIG. 2A, active zones 201, 202 and isolation structures 211, 212 are defined in a substrate 2 (e.g. a silicon substrate). For example, the isolation structures 211 and 212 are shallow trench isolation (STI) structures. By a high voltage P-well region (HV P-Well) implantation process and a high voltage N-well region (HV N-well) implantation process, the structure as shown in FIG. 2A may be divided into an N-channel metal-oxide-semiconductor field-effect transistor (NMOS) area and a P-channel metal-oxide-semiconductor field-effect transistor (PMOS) area. That is, the active zone 201 and the isolation structure 211 are located at the NMOS area, and the active zone 202 and the isolation structure 212 are located at the PMOS area.

Figure 2B:
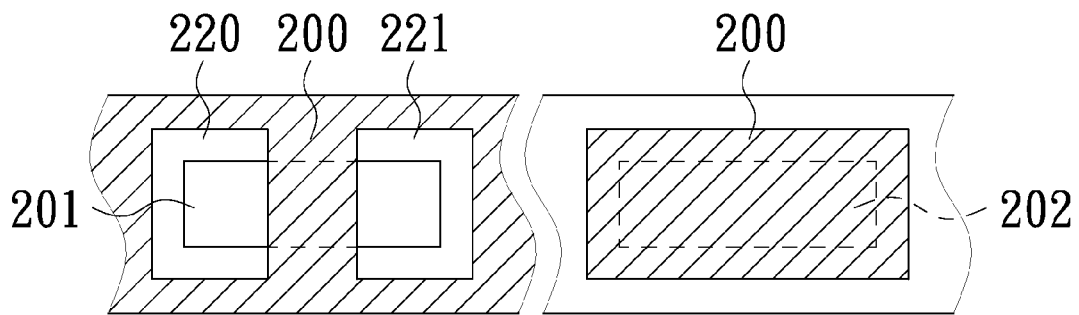
Figure 2C:
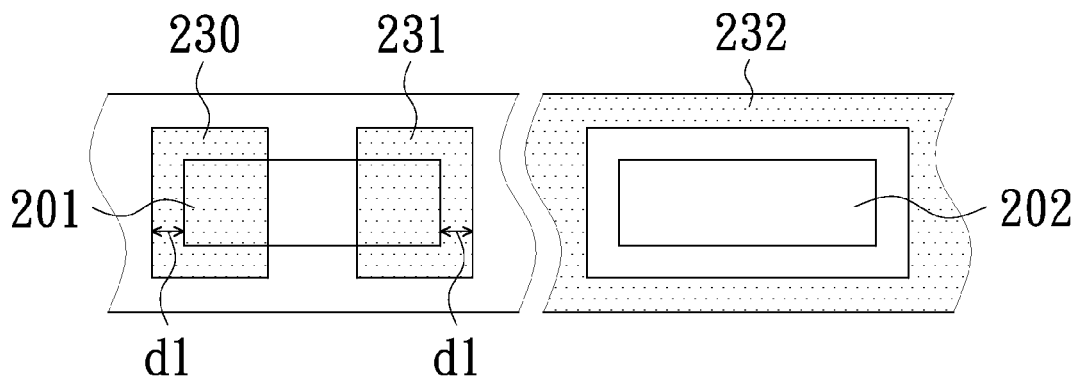

Then, a photolithography is performed to produce a mask layer and several openings, for example a mask layer 200 and two opening 220, 221 (see FIG. 2B). The active zone 202 is sheltered by the mask layer 200. The openings 220 and 221 are located at two ends of the active zone 201, respectively.

Then, two ion implantation processes are performed to implant dopant species into the exposed region through the openings that are unsheltered by the mask layer 200. Consequently, two N-grade regions 230, 231 and an N-field region 232 are formed (see FIG. 2C). In this embodiment, the two ion implantation processes are carried out by the same mask layer shape and the openings. That is, after the N-field region 232 with a deeper doped depth is formed by a first ion implantation process, the N-grade regions 230 and 231 with a shallower doped depth are formed by a second ion implantation process. In this embodiment, the dopant species for the N-grade regions 230 and 231 and the dopant species for the N-field region 232 have the same type and the substantially identical concentration. Whereas, the doped depths are different. That is, the doped depth of the N-field region 232 is greater than the doped depth of the N-grade regions 230 and 231. It is preferred that the doped depth of the N-field region 232 is deeper than the bottom of the shallow trench isolation structures.

From the above discussions, the ion implantation processes for forming the N-field region 232 and the N-grade regions 230 and 231 utilize the mask layer and the openings of the same photo mask. Consequently, the number of photo masks can be effectively reduced, and the purpose of the present invention will be achieved. Moreover, each of the N-grade regions 230 and 231 is extended beyond a corresponding end of the active zone 201 by a length d1 (e.g. about 0.3 micrometer).

Figure 2D:
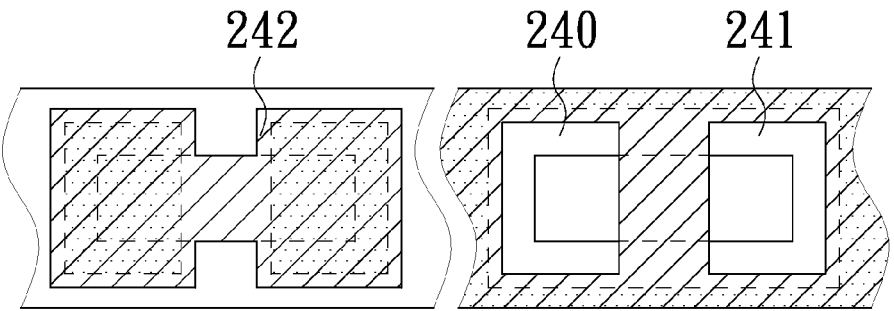
Figure 2E:
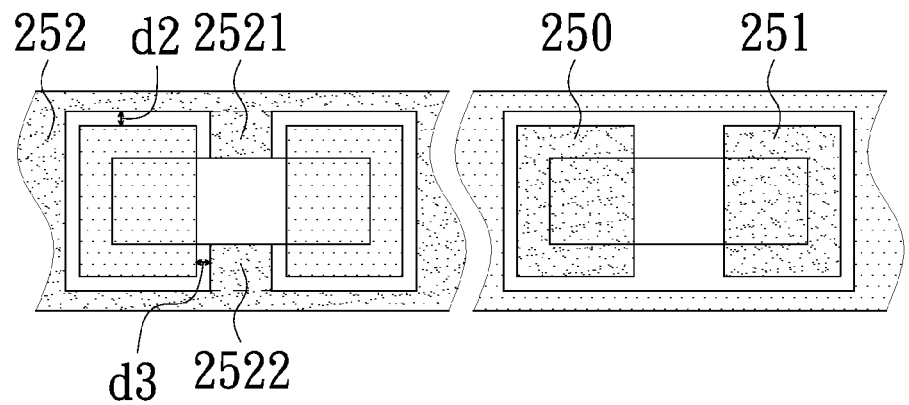

Then, another photolithography process is performed to produce a mask layer and several openings, for example a mask layer 242 and two opening 240, 241 (see FIG. 2D). The active zone 201 is sheltered by the mask layer 242. The openings 240 and 241 are located at two ends of the active zone 202, respectively.

Then, two ion implantation processes are performed to implant dopant species into the exposed region through the openings that are unsheltered by the mask layer 242. Consequently, two P-grade regions 250, 251 and a P-field region 252 are formed (see FIG. 2E). In this embodiment, the two ion implantation processes are carried out by the same mask layer shape and the openings. That is, after the P-field region 252 with a deeper doped depth is formed by a first ion implantation process, the P-grade regions 250, 251 with a shallower doped depth are formed by a second ion implantation process. In this embodiment, the dopant species for the P-grade regions 250, 251 and the dopant species for the P-field region 252 have the same type and the substantially identical concentration. Whereas, the doped depths are different. That is, the doped depth of the P-field region 252 is greater than the doped depth of the P-grade regions 250, 251. It is preferred that the doped depth of the P-field region 252 is deeper than the bottom of the shallow trench isolation structures. Similarly, the ion implantation processes for forming the P-field region 252 and the P-grade regions 250, 251 utilize the mask layer and the openings of the same photo mask. Consequently, the number of photo masks can be effectively reduced, and the purpose of the present invention will be achieved.

However, if boron is used as the dopant species for forming the high voltage P-well region (HV P-Well) of the N-channel metal-oxide-semiconductor field-effect transistor, an inverse narrow width effect (INWE) or a narrow width device VT instability problem occurs. For enhancing the device stability, the mask layer 242 of the active zone 201 of the NMOS area is specially designed. For example, the mask layer 242 has a dumbbell-shape configuration with wider end parts and narrower middle part. Due to the dumbbell-shape configuration of the mask layer 242, the P-field region 252 has a first protrusion part 2521 and a second protrusion part 2522 extended inwardly toward the middle segment of the active zone 201 for preventing boron of the high voltage P-well region (HV P-Well) from diffusion to the surroundings. In this embodiment, the N-grade region 230 (or 231) is separated from the P-field region 252 by a distance d2 of about 0.05 micrometer. In addition, the N-grade region 231 is separated from the first protrusion part 2521 or the second protrusion part 2522 of the P-field region 252 by a distance d3 of about 0.2 micrometer.

Figure 2F:
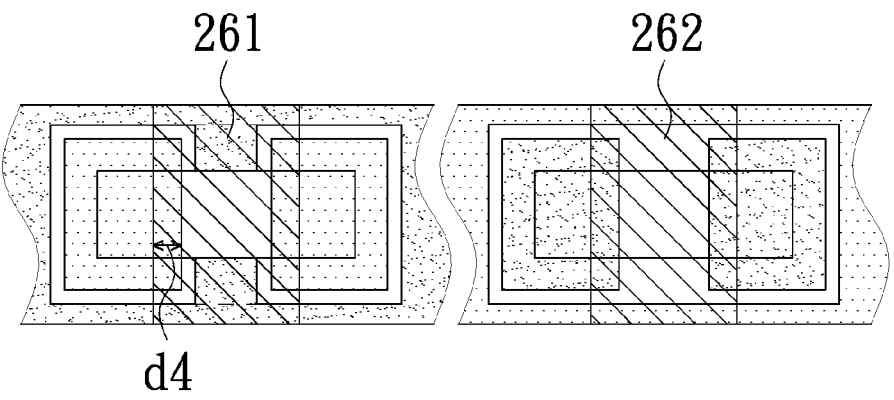

Then, as shown in FIG. 2F, two gate conductor structures 261 and 262 (e.g. polysilicon conductors) are formed over the middle segments of the active zones 201 and 202, respectively. The overlapping region between the N-grade region 230 and the gate conductor structure 261 has a width d4 of about 0.7 micrometer. Similarly, the overlapping region between the N-grade region 231 and the gate conductor structure 262 has a width d4 of about 0.7 micrometer. Then, by using the gate conductor structures 261 and 262 and subsequently-formed sidewalls as the implantation masks, ion implantation processes are performed to form a heavily N-doped region (N+) and a heavily P-doped region (P+), which are the source/drain regions of the N-channel metal-oxide-semiconductor field-effect transistor and a P-channel metal-oxide-semiconductor field-effect transistor, respectively. Meanwhile, the basic structures of the N-channel metal-oxide-semiconductor field-effect transistor and the P-channel metal-oxide-semiconductor field-effect transistor are produced.

Figure 3:
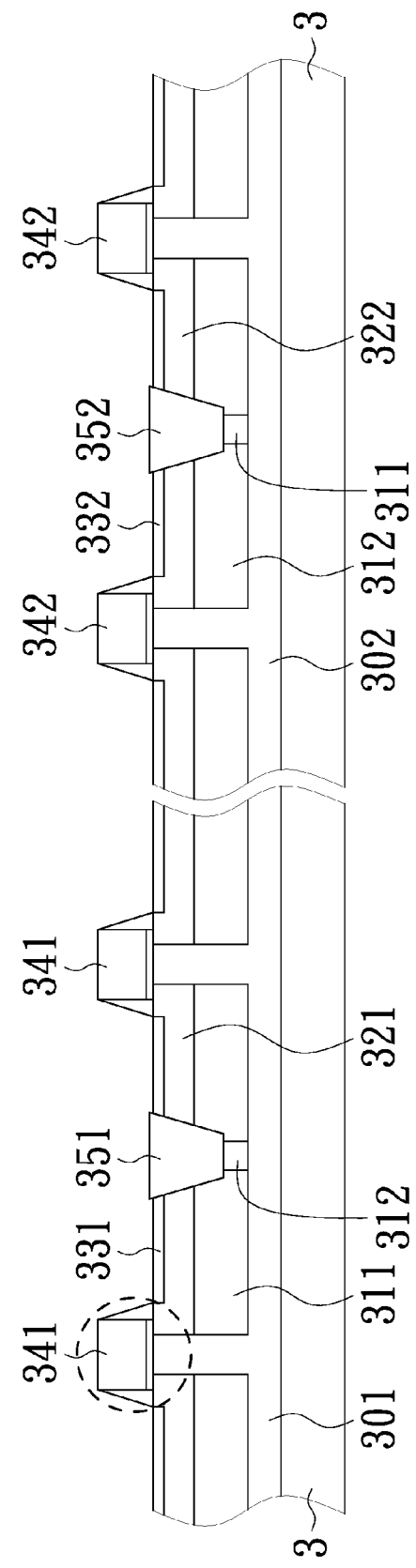
FIG. 3 is a schematic cross-sectional view illustrating an N-channel metal-oxide-semiconductor field-effect transistor and a P-channel metal-oxide-semiconductor field-effect transistor produced by the fabricating method for the present invention.

FIG. 3 is a schematic cross-sectional view illustrating an N-channel metal-oxide-semiconductor field-effect transistor and a P-channel metal-oxide-semiconductor field-effect transistor produced by the fabricating method for the present invention. In FIG. 3, a high voltage P-well region 301, a high voltage N-well region 302, an N-field region 311, a P-field region 312, an N-grade region 321, a P-grade region 322, a heavily N-doped region 331, a heavily P-doped region 332, a first gate structure 341, and a second gate structure 342. The heavily N-doped region 331 and the heavily P-doped region 332 are the source/drain regions of the N-channel metal-oxide-semiconductor field-effect transistor and a P-channel metal-oxide-semiconductor field-effect transistor, respectively. The P-field region 312 located under the shallow trench isolation (STI) structure 351 and between two adjacent NMOS transistors is used for isolating these NMOS transistors. The P-field region 312 located under the shallow trench isolation (STI) structure 352 and between two adjacent PMOS transistors is used for isolating these PMOS transistors. In this embodiment, the N-field region 311 and the N-grade region 321 are produced by ion implantation processes, wherein the mask layer is defined by a photolithography and etching process. Moreover, the P-field region 312 and the P-grade region 322 are subject to ion implantation processes with another mask layer, wherein the mask layer is defined by another photolithography and etching process. Consequently, the number of the photo masks is reduced.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A high voltage semiconductor device, comprising:
    a substrate having a first active zone and a second active zone both extending along a first direction;
    a first-polarity doped region formed at two ends of the first active zone and a periphery but outside of the second active zone;
    a second-polarity doped region formed at two ends of the second active zone and a periphery but outside of the first active zone, wherein the second-polarity doped region at the periphery of the first active zone has a first protrusion part and a second protrusion part both extending toward a middle segment of the first active zone as well as along a second direction, wherein the first direction is different from the second direction;
    a first gate conductor structure formed over the middle segment of the first active zone; and
    a second gate conductor structure formed over a middle segment of the second active zone.

2. The high voltage semiconductor device according to claim 1, further comprising;
    a first-polarity source/drain region formed over the first-polarity doped region; and
    a second-polarity source/drain region formed over the second-polarity doped region.

3. The high voltage semiconductor device according to claim 1, wherein the first-polarity doped region comprises:
    a first-polarity field region formed at the periphery of the second active zone; and
    a first-polarity grade region formed at the two ends of the first active zone.

4. The high voltage semiconductor device according to claim 3, wherein the first-polarity grade region is extending beyond a corresponding end of the first active zone by a length of about 0.3 micrometer.

5. The high voltage semiconductor device according to claim 3, wherein the second-polarity doped region comprises:
    a second-polarity field region formed at the periphery of the first active zone; and
    a second-polarity grade region formed at the two ends of the second active zone.

6. The high voltage semiconductor device according to claim 5, wherein the first-polarity grade region at the two ends of the first active zone is separated from the second-polarity field region by a distance of about 0.05 micrometer.

7. The high voltage semiconductor device according to claim 5, wherein the second-polarity field region at the periphery of the first active zone has the first protrusion part and the second protrusion part, wherein the first protrusion part or the second protrusion part is separated from the first-polarity grade region by a distance of about 0.2 micrometer.

8. The high voltage semiconductor device according to claim 1, wherein the first gate conductor structure or the second gate conductor structure has a polysilicon conductor.

9. The high voltage semiconductor device according to claim 8, wherein an overlapping region between the polysilicon conductor and the first-polarity grade region has a width of about 0.7 micrometer.

10. The high voltage semiconductor device according to claim 1, wherein the substrate is a silicon substrate, the first-polarity grade region is an N-grade region, the second-polarity grade region is a P-grade region, the first-polarity field region is an N-field region, and the second-polarity field region is a P-field region.

* * * * *